US006583454B2

(12) United States Patent
Sheppard et al.

(10) Patent No.: US 6,583,454 B2
(45) Date of Patent: Jun. 24, 2003

(54) NITRIDE BASED TRANSISTORS ON SEMI-INSULATING SILICON CARBIDE SUBSTRATES

(75) Inventors: Scott Thomas Sheppard, Chapel Hill, NC (US); Scott Thomas Allen, Apex, NC (US); John Williams Palmour, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/821,360

(22) Filed: Mar. 29, 2001

(65) Prior Publication Data

US 2001/0017370 A1 Aug. 30, 2001

Related U.S. Application Data

(62) Division of application No. 09/096,967, filed on Jun. 12, 1998, now Pat. No. 6,316,793.

(51) Int. Cl.[7] ................. H01L 31/0328; H01L 31/0336; H01L 31/072; H01L 31/019
(52) U.S. Cl. ................. 257/194; 257/190; 257/192
(58) Field of Search ................. 257/194, 192, 257/201, 12, 24, 27, 103, 190

(56) References Cited

U.S. PATENT DOCUMENTS

| 4,471,366 A | | 9/1984 | Delagebeaudeuf et al. . 257/194 |
| 5,192,987 A | | 3/1993 | Khan et al. ................. 257/280 |
| 5,237,182 A | * | 8/1993 | Kitagawa et al. ............. 257/15 |
| 5,296,395 A | | 3/1994 | Khan et al. ................. 438/149 |
| 5,319,223 A | * | 6/1994 | Fujita et al. ................. 257/190 |
| 5,739,557 A | * | 4/1998 | O'Neil et al. ............... 257/192 |
| 5,831,277 A | | 11/1998 | Razeghi ........................ 257/15 |
| 5,929,466 A | | 7/1999 | Ohba et al. ................. 257/103 |
| 5,933,705 A | | 8/1999 | Geels et al. ................... 438/26 |
| 6,316,820 B1 | | 11/2001 | Schmitz et al. ............. 257/649 |

OTHER PUBLICATIONS

Sullivan et al., High power RF operation of AlGaN/GaN HEMTs grown on insulating silicon carbide substrates, Apr. 30, 1998, Electronics Letters, V34, N9, pp. 922–924.*
Chu; High Speed Semiconductor Devices and Circuits, Proceedings, IEEE/Cornell Conference on Advanced Concepts, 1997, pp. 399–406.*
Sullivan, G.J., et al.; "High–Power 10–GHz Operation of AlGaN HFET's on Insulating SiC," IEEE Electron Device Letters, vol. 19, No. 6, Jun. 1998, pp. 198–20.
Ping, A.T., et al.; "DC and Microwave Performance of High–Current AlGaN/GaN Heterostructure Field Effect Transistors Grown on p–Type SiC Substrates," IEEE Electron Device Letters, vol. 19, No. 2, Feb. 1998, pp. 54–56.
Gaska, R., et al.; "High–Temperature Performance of AlGaN/GaN HFET's on SiC Substrates," IEEE Electron Device Letters, vol. 18, No. 10, Oct. 1997, pp. 492–494.
Wu, Y–F., et al.; "High Al–Content AlGaN/GaN MOD-FET's for Ultrahigh Performance," IEEE Electron Device Letters, vol. 19, No. 2, Feb. 1998, pp. 50–53.
Polyakov A.Y., et al.; "The Influence of Hydrogen Plasma Passivation on Electrical and Optical Properties of AlGaN Samples Grown on Sapphire," III–Nitride, SIC and Diamond Materials for Electronic Devices, Apr. 1996, pp. 607–611.

* cited by examiner

*Primary Examiner*—Shouxiang Hu
(74) *Attorney, Agent, or Firm*—Summa & Allan, P.A.

(57) ABSTRACT

A high electron mobility transistor (HEMT) is disclosed that includes a semi-insulating silicon carbide substrate, an aluminum nitride buffer layer on the substrate, an insulating gallium nitride layer on the buffer layer, an active structure of aluminum gallium nitride on the gallium nitride layer, a passivation layer on the aluminum gallium nitride active structure, and respective source, drain and gate contacts to the aluminum gallium nitride active structure.

4 Claims, 2 Drawing Sheets

NITRIDE BASED TRANSISTORS ON SEMI-INSULATING SILICON CARBIDE SUBSTRATES

CROSS-REFERENCE TO RELATED APPLICATION

This applicatian is a divisional of copending U.S. application Ser. No. 09/096,967, filed Jun. 12, 1998 now U.S. Pat. No. 6,316,793.

FIELD OF THE INVENTION

The present invention relates to high frequency transistors and in particular relates to a high electron mobility transistor (HEMT) that incorporates nitride-based active layers and a silicon carbide substrate. This invention was developed under U.S. Army Research Laboratory Contract No. DAAL01-96-C-3604. The government may have certain rights in this invention.

BACKGROUND OF THE INVENTION

The present invention relates to transistors formed of semiconductor materials that make them suitable for high power, high temperature, and high frequency applications. As known to those familiar with semiconductors, materials such as silicon (Si) and gallium arsenide (GaAs) have found wide application in semiconductor devices for lower power and (in the case of Si) lower frequency applications. These more familiar semiconductor materials have failed to penetrate higher power high frequency applications to the extent desirable, however, because of their relatively small bandgaps (e.g., 1.12 eV for Si and 1.42 for GaAs at room temperature) and relatively small breakdown voltages.

Accordingly, interest in high power high temperature and high frequency applications and devices has turned to wide bandgap semiconductor materials such as silicon carbide (2.996 eV for alpha SiC at room temperature) and the Group III nitrides (e.g., 3.36 eV for GaN at room temperature). These materials have higher electric field breakdown strengths and higher electron saturation velocities as compared to gallium arsenide and silicon.

A device of particular interest is the high electron mobility transistor (HEMT), which is also known as a modulation doped field effect transistor (MODFET). These devices offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped, smaller bandgap material and can contain a very high sheet electron concentration on the order of $10^{12}$ to $10^{13}$ carriers/cm$^2$. Additionally, electrons that originate in the doped, wider-bandgap semiconductor transfer to the 2DEG, allowing a high electron mobility due to reduced ionized impurity scattering.

This combination of high carrier concentration and high carrier mobility gives the HEMT a very large transconductance and a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of their unique combination of material characteristics which includes the aforementioned high breakdown fields, their wide bandgaps, large conduction band offset, and high saturated electron drift velocity. A major portion of the electrons in the 2DEG is attributed to pseudomorphic strain in the AlGaN; see, e.g., P. M. Asbeck et al., Electronics Letters, Vol. 33, No. 14, pp. 1230–1231 (1997); and E. T. Yu et al., Applied Physics Letters, Vol. 71, No.19, pp. 2794–2796 (1997).

HEMTs in the GaN/AlGaN system have been demonstrated. U.S. Pat. Nos. 5,192,987 and 5,296,395 to Khan et al. (which are related as parent and divisional) describe HEMTs formed of a heterojunction between AlGaN and GaN on a buffer and a substrate. Other devices have been described by Gaska et al., "High-Temperature Performance of AlGaN/GaN HFET's on SiC Substrates," IEEE Electron Device Letters, Vol.18, No.10, October 1997 at page 492; and Ping et al., "DC and Microwave Performance of High-Current AlGaN/GaN Heterostructure Field Effect Transistors Grown on P-Type SiC Substrates," IEEE Electron Letters, Vol.19, No.2, February 1998, at page 54. Some of these devices have shown $f_T$ values as high as 67 gigahertz (K. Chu et al., WOCSEMMAD, Monterey, Calif., February 1998) and high power densities up to 2.84 W/mm at 10 GHz (G. Sullivan et al., "High-Power 10-GHz Operation of AlGaN HFET's in Insulating SiC," IEEE Electron Device Letters, Vol. 19, No. 6, June 1998, pp. 198; and Wu et al., IEEE Electron Device Letters, Volume 19, No. 2, page 50, February 1998.)

In spite of this progress, the gate peripheries corresponding to these results have been too small to produce significant amounts of total microwave power with high efficiency and high associated gain. Thus the devices have tended to be of more academic than practical interest.

High power semiconducting devices of this type operate in a microwave frequency range and are used for RF communication networks and radar applications and offer the potential to greatly reduce the complexity and thus the cost of cellular phone base station transmitters. Other potential applications for high power microwave semiconductor devices include replacing the relatively costly tubes and transformers in conventional microwave ovens, increasing the lifetime of satellite transmitters, and improving the efficiency of personal communication system base station transmitters.

Accordingly, the need exists for continued improvement in high frequency high power semiconductor based microwave devices.

OBJECT AND SUMMARY OF THE INVENTION

Therefore, it is an object of the present invention to provide a high electron mobility transistor (HEMT) that takes advantage of the electronic properties of Group III nitrides, and that does so in a manner superior to other existing and related devices.

The invention meets this object with a high electron mobility transistor (HEMT) that comprises a semi-insulating silicon carbide substrate, an aluminum nitride buffer layer on the substrate, an insulating gallium nitride layer on the buffer layer, an active structure of aluminum gallium nitride on the gallium nitride layer, a passivation layer on the aluminum gallium nitride active structure, and respective source, drain and gate contacts to the aluminum gallium nitride active structure.

The foregoing and other objects and advantages of the invention and the manner in which the same are accomplished will become clearer based on the following detailed description taken in conjunction with the accompanying drawings in which:

DETAILED DESCRIPTION

Figure 1:
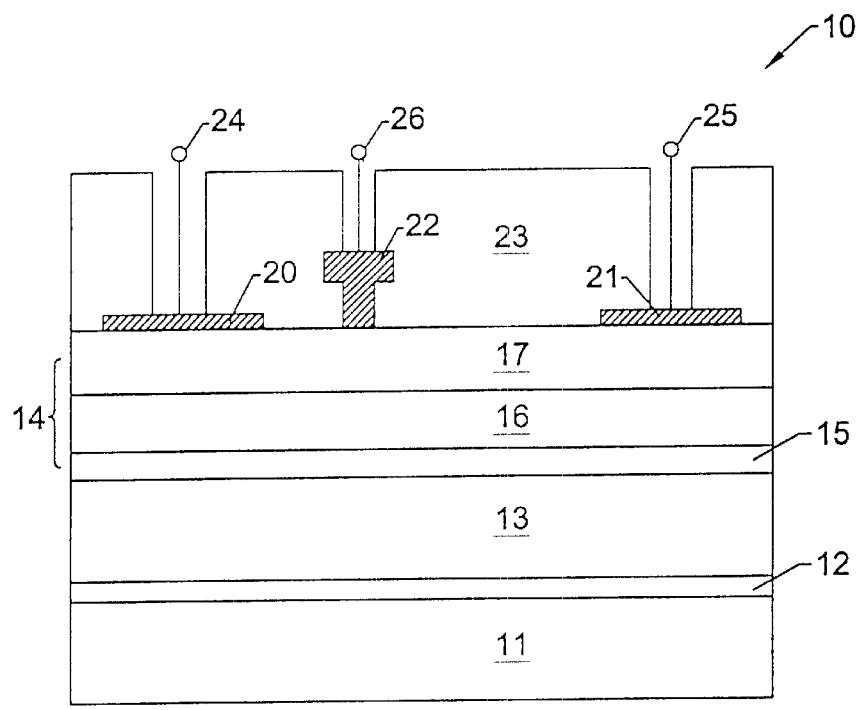
FIG. 1 is a cross-sectional view of a transistor according to the present invention.

The present invention is a high electron mobility transistor (HEMT), the overall structure of which is schematically illustrated at 10 in the cross-sectional view of FIG. 1. The transistor 10 comprises a semi-insulating silicon carbide (SiC) substrate 11 which in preferred embodiments comprises the 4H polytype of silicon carbide. Other silicon carbide candidate polytypes include the 3C, 6H, and 15R polytypes. The term "semi-insulating" is used descriptively rather than in an absolute sense and generally refers to a silicon carbide bulk crystal with a resistivity equal to a higher than $1 \times 10^5$ Ω-cm at room temperature. Others in this art would refer to such resistivities as "insulating," but those familiar with the art will recognize the characteristics referred to.

An aluminum nitride buffer layer 12 is on the substrate 11 and provides an appropriate crystal structure transition between the silicon carbide substrate and the remainder of the transistor. Silicon carbide has a much closer crystal lattice match to Group III nitrides than does sapphire ($Al_2O_3$) which is a very common substrate material for Group III nitride devices. The closer lattice match results in Group III nitride films of higher quality than those generally available on sapphire. Perhaps most importantly, silicon carbide also has a very high thermal conductivity so that the total output power of Group III nitride devices on silicon carbide is not as limited by thermal dissipation of the substrate as in the case of the same devices formed on sapphire. Also, the availability of semi-insulating silicon carbide substrates provide the capacity for device isolation and reduced parasitic capacitance that make workable commercial devices feasible.

As used herein, the term "Group III nitride" refers to those semiconducting compounds formed between nitrogen and the elements in Group III of the periodic table, usually aluminum (Al), gallium (Ga), and indium (In). The term also refers to ternary and tertiary compounds such as AlGaN and AlInGaN. As is well understood by those in this art, the Group III elements can combine with nitrogen to form binary (e.g., GaN), ternary (e.g., AlGaN), and tertiary (e.g., AlInGaN) compounds. These compounds all have empirical formulas in which one mole of nitrogen is combined with a total of one mole of the Group III elements. Accordingly, formulas such as $Al_xGa_{1-x}N$ where $1>x>0$ are often used to describe them.

Appropriate SiC substrates are available from Cree Research, Inc., of Durham, N.C., the assignee of the present invention, and the methods for producing them are set forth in the scientific literature as well as in a number of commonly assigned U.S. patents, including but not limited to U.S. Pat. Nos. Re. 34,861; 4,946,547; and 5,200,022, the contents of which are incorporated entirely herein by reference. Similarly, techniques for epitaxial growth of Group III nitrides have become reasonably well developed and reported in the appropriate scientific literature, and in commonly assigned U.S. Pat. Nos. 5,210,051; 5,393,993; 5,523,589; and 5,292,501; the contents of which are also incorporated entirely herein by reference.

The HEMT 10 next comprises an insulating gallium nitride layer 13 on the aluminum nitride buffer layer 12. The gallium nitride layer is much thicker (on the order of 1–2 microns total) than the aluminum nitride buffer layer 12, which can have a thickness between 100 and 5000 Å. The gallium nitride layer 13 is grown such that the electron carrier concentration is lower than $10^{15}$ electrons/$cm^3$, which makes it sufficiently insulating for the high frequency applications of interest.

The HEMT 10 of the present invention next includes an active structure designated by the brackets 14 on the gallium nitride layer 13 to produce an energy offset in the conduction band at the interface between the layers 13 and 14. The band offset creates a narrow potential well in which free electrons can reside, which results in a very thin sheet of high concentration of electrons; i.e., the two-dimensional electron gas (2DEG) that gives the device its performance characteristics. As those familiar with these devices recognize, the effect is similar to a MESFET with a very thin channel.

In the most preferred embodiment, the AlGaN portion 14 comprises a three-layer structure formed of a first undoped aluminum gallium nitride layer 15 on the gallium nitride layer 13, a conductively doped (preferably n-type) aluminum gallium nitride layer 16 on the first undoped layer 15, and a second undoped AlGaN layer 17 on the conductively doped AlGaN layer 16. In a second possible embodiment, the three AlGaN layer 15, 16, and 17 are all intentionally undoped. It is likewise expected that the layer 15 could be formed of either InGaN or AlInGaN, and that the resulting devices will have the advantageous properties and characteristics described herein.

A very important property of the heterostructures in the III-Nitride system is essential for the high performance of the AlGaN/GaN HEMT. In addition to the accumulation of electrons due to the band offset between the layers 13 and 14, the total number of free electrons is enhanced greatly by pseudomorphic strain in the AlGaN portion 14 relative to the GaN layer 13. Due to localized piezoelectric effects, the strain causes an enhanced electric field and a higher electron concentration than would be possible were the strain not present. The resulting sheet electron concentrations in the 2DEG are on the order of $10^{13}$ electrons/$cm^2$.

Respective source, drain, and gate contacts (20, 21, and 22 in FIG. 1) are made to the aluminum gallium nitride active portion 14, and in the preferred embodiment are made to the undoped AlGaN layer 17. The undoped AlGaN layer 17, which is also referred to as a barrier layer, improves the characteristics of the rectifying (Schottky) gate contact of the transistor, although it will be understood that the gate contact can be placed directly on the doped portion of AlGaN with the device still being operable.

In FIG. 1, the device is shown in cross section along the direction of current. Electrons flow from the source contact to the drain contact through the highly conductive 2DEG at the AlGaN/GaN interface. The voltage impressed on the gate electrode electrostatically controls the number of electrons in the 2DEG directly under the gate, and thus controls the total electron flow from source to drain. The gate length ($L_G$), gate-to-source spacing ($L_{GS}$), gate-to-drain spacing ($L_{GD}$) are critical dimensions usually designated in units of micrometers (microns). The dimension of the HEMT that is perpendicular to current flow (normal to the page) is referred to as the device width or gate periphery and is described herein in units of millimeters (mm).

Similarly, the first undoped AlGaN layer 15 provides a spacer layer that separates the free electrons in the 2DEG from the scattering centers left behind in the doped layer 16, thus improving the electron mobility by separating the electrons in the well from these scattering centers which would otherwise totally govern the electron mobility.

It has been determined according to the present invention that the device has particularly good performance characteristics when it includes a passivation layer 23 on the aluminum gallium nitride active portion 14. As illustrated in FIG. 1, the passivation layer 23 preferably covers the immediate contact portions of the source, drain, and gate contacts 20, 21, and 22, with windows opened therein to permit connection through the respective wire bonds shown schematically at 24, 25, and 26 extending from the passivation layer 23. Although the applicants neither wish nor intend to be bound by any particular theory, it appears that unterminated chemical bonds at the surface of a high-frequency device with a rectifying metal contact can create charge states that disrupt device operation by trapping a proportion of the electrons that would otherwise flow in the channel of a MESFET, or in the 2DEG of a HEMT. The passivation layer 23 of the present invention appears to minimize or eliminate this and similar problems.

In preferred embodiments of the invention, the source and drain contacts 20 and 21 are preferably formed of alloys of titanium, aluminum, and nickel, and the rectifying gate contact is preferably selected from the group consisting of titanium, platinum, chromium, alloys of titanium and tungsten, and platinum silicide. In a particularly preferred embodiment, the ohmic contacts are formed of an alloy of nickel, silicon, and titanium that is formed by depositing respective layers of these materials, and then annealing them. Because this alloy system eliminates aluminum, it avoids unwanted aluminum contamination over the device surface when the anneal temperature exceeds the melting point of aluminum (660° C.).

The passivation layer 23 is preferably selected from the group consisting of silicon nitride ($Si_3N_4$) and silicon dioxide ($SiO_2$), with silicon nitride being particularly preferred. The passivation layer 23 can be formed by either low pressure or plasma-enhanced chemical vapor deposition (LPCVD or PECVD).

As known to those familiar with these devices, the ternary compound aluminum gallium nitride is generally formed according to the formula $Al_xGa_{1-x}N$ where 1 is greater than x and x is greater than 0 (1>x>0). In the present invention, the value of x can be the same or different for the respective AlGaN layers 15, 16, and 17, and in a preferred embodiment, the value of x is 15 so that the formula is $Al_{0.15}Ga_{0.85}N$. In this regard, a higher mole fraction of aluminum (higher "x") provides a better sheet charge, but lowers the crystal quality and is more difficult to grow. Accordingly, the mole fraction of aluminum is preferably selected to be as high as possible without causing substantial crystal problems or too much current. At present, a mole fraction of aluminum of between about 0.10 and 0.50 is considered preferable.

The device according to the present invention is characterized by extremely high performance, better than that demonstrated elsewhere to date. In particular, HEMTs according to the present invention have been characterized by measured output power of at least two watts per millimeter and total output power for two millimeter devices of at least four watts. Modeling of the devices indicates that output power of between four and five watts per millimeter are expected to be obtained from these devices and, because 40 mm devices are expected to be available, the devices are expected to be able to produce total output power of as much as 160–200 watts.

It will be recognized by those of ordinary skill in this art, however, that the maximum width of HEMT devices is frequency-specific, with wider devices being limited to lower frequencies and narrower devices being required for higher frequencies. For example, at 10 GHz 20 mm would represent the maximum device width, while at 3 GHz the device would have a width of about 50–60 mm.

Figure 2:
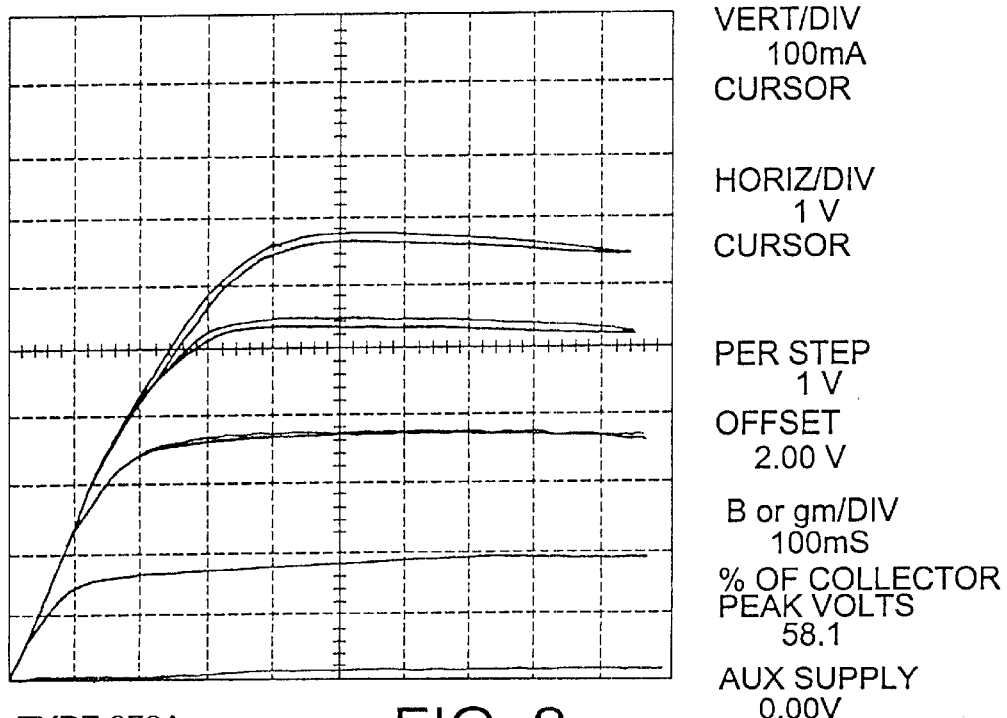
FIG. 2 is a plot of the current-voltage (IV) characteristics of a transistor according to the present invention.
Figure 4:
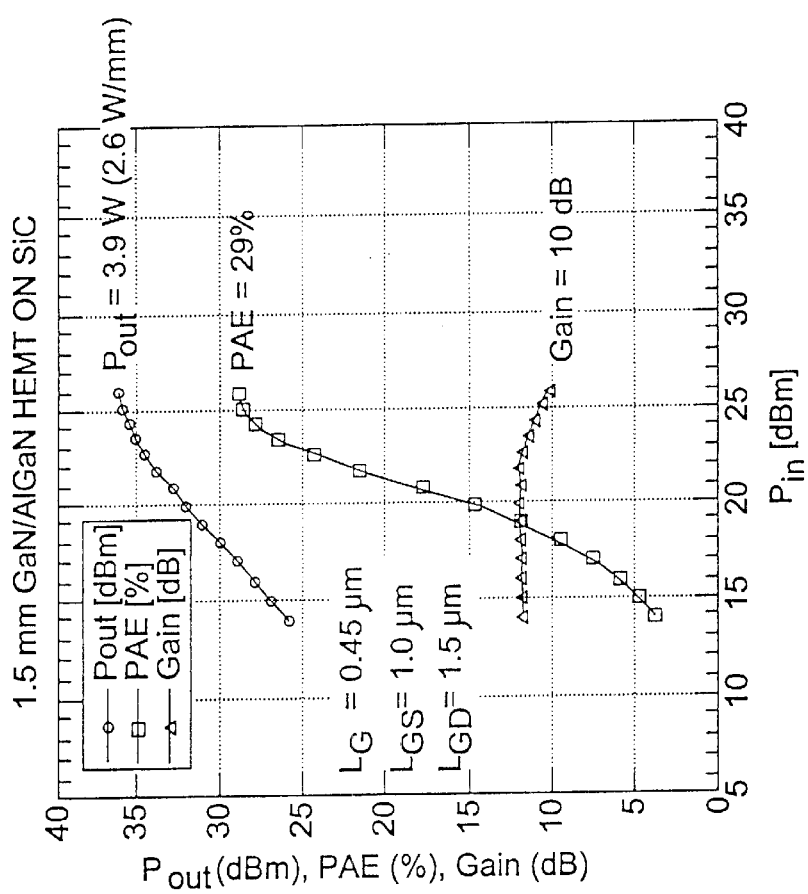
FIG. 4 is a plot of the results of a gain power sweep for yet another transistor according to the present invention.
Figure 3:
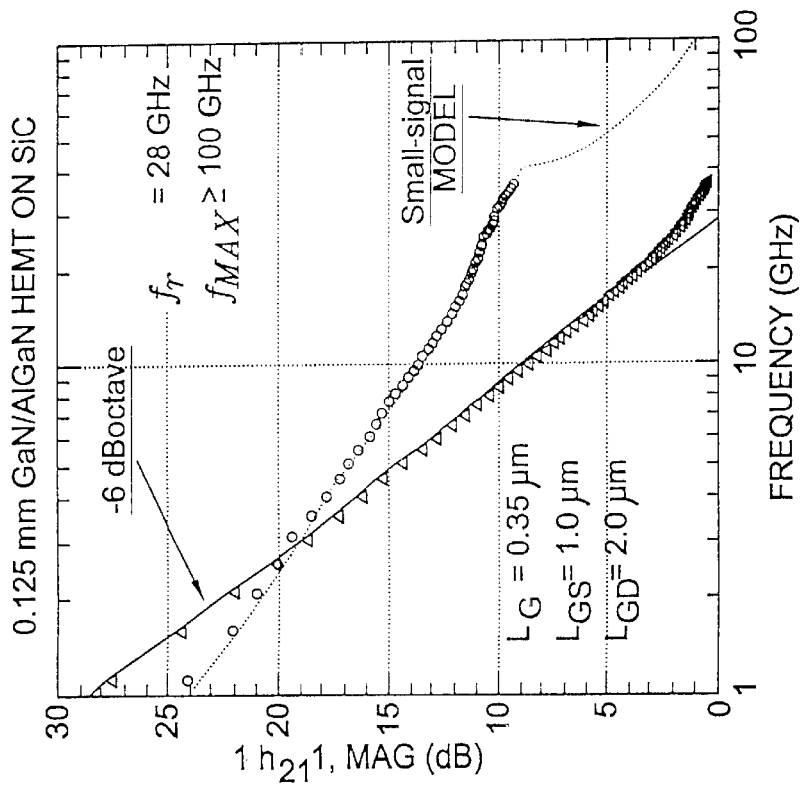
FIG. 3 is a dual plot of two of the small signal characteristics of another transistor according to the present invention.

Accordingly, in another aspect, the invention can be expressed as a high electron mobility transistor that comprises a semi-insulating silicon carbide substrate and a heterojunction between gallium nitride and aluminum gallium nitride and that is characterized by the performance characteristics of FIG. 2, or those of FIG. 3, or those of FIG. 4.

Description of FIGS. 2–4

FIGS. 2–4 illustrate a number of the specific features of HEMTs according to the present invention. FIG. 2 illustrates the output characteristics of a 1 mm device for which the gate length (Lg) was 0.45 microns, the gate-source distance (Lgs) was 1 micron, and the gate-drain distance (Lgd) was 1.5 microns. The gate sweep began at a gate voltage of 2.0 volts followed by steps decreasing by 1 volt to generate the characteristic family of curves of FIG. 2. As indicated by FIG. 2, at a gate voltage of –2.0 V, the current is effectively shut off.

FIG. 3 is a plot of 2 different variables: the absolute value of short-circuit current gain (|h21|) and the maximum available gain (MAG in decibels) as against frequencies of 1–100 gigahertz (GHz). The frequency scale of FIG. 3 is logarithmic. The transistor dimensions are listed on FIG. 3 and represent a 0.125 mm HEMT according to the present invention. As FIG. 3 indicates, the unity gain frequency of operation ($f_T$) is identified by the point at which the absolute value of h12 is 0 dB. By using an extrapolation with a line of –6 dB/octave, a conservative estimate for $f_T$ is about 28 GHz.

FIG. 4 illustrates the characteristics based on a 10 GHz power sweep for a 1.5 millimeter HEMT according to the present invention. The drain voltage was 32 V and FIG. 4 illustrates the output power, the power added efficiency, and the gain. The dimensions of the transistor are superimposed on the plot of FIG. 4. The input power forms the horizontal axis in FIG. 4.

EXAMPLE

In the present invention, GaN/AlGaN HEMTs fabricated on semi-insulating 4H silicon carbide substrates have shown a total output power of 4 Watts CW (2.0 W/mm) at 10 GHz and –1 dB gain compression from a 2 mm gate width (16×125 μm) with a power added efficiency of 29% and an associated gain of 10 dB. To date, this represents the highest total power and associated gain demonstrated for a III-Nitride HEMT at X-Band.

As shown in FIG. 1, the epilayer structure is comprised of an AlN Buffer Layer, 2 μm of undoped GaN, and 27 nm of $Al_{0.14}Ga_{0.86}N$. The AlGaN cap has a 5 nm undoped spacer layer, a 12 nm donor layer, and a 10 nm undoped barrier layer. Device isolation was achieved with mesa etching. Ohmic contacts were Ti/Al/Ni contacts annealed at 900° C. Across a 35 mm diameter SiC wafer, average values of contact resistance and sheet resistance were 0.36 Ω-mm and 652 Ω/square, respectively, showing the high quality of the 2DEG over a large area.

Typical output characteristics of a 1 mm wide HEMT with $L_G$=0.45, $L_{GS}$=1.0, and $L_{GD}$=1.5 µm are shown in FIG. 2. The peak current achieved at $V_{GS}$=+2 V is 680 mA/mm, and a maximum extrinsic transconductance near $V_{GS}$=−0.5 V of 200 mS/mm shows the excellent current handling capability of these devices. The device behavior scaled well for all gate widths, ranging from 125 µm to 2 mm. FIG. 3 shows the small signal gain measurements (Δ=|h$_{21}$| and 0=MAG) on a 0.35 µm device at $V_{DS}$=20 V and $V_{gs}$=−1The extrapolated unity gain frequency $f_T$ was 28 GHz. The Maximum Available Gain (MAG) remained high up to the maximum frequency of the network analyzer. Small-signal parameters, that were extracted from the data below 35 GHz, were used to model the power gain (dotted line on FIG. 3), which estimates $f_{MAX}$ to be 114 GHz. The MAG was 13.8 dB at 10 GHz.

On wafer load-pull measurements were performed at 10 GHz at a drain bias of 32 V. A power sweep for a 1.5 mm HEMT with $L_G$=0.45, $L_{GS}$=1.0, and $L_{GD}$=1.5 µm is shown in FIG. 4. The linear gain of about 12 dB was maintained up to an input power of 22 dBm. A total RF power of 3.54 Watts (2.37 W/mm), PAE of 28.3%, and an associated gain of 11 dB were achieved at only 1 dB of compression. A sampling of other large devices, ranging between 1 and 2 mm, showed power densities at or above 2 W/mm for 1 dB compression, where several 2 mm devices operated at 4 Watts. The highest power measured on the wafer for a 1.5 mm HEMT was 3.9 W (2.6 W/mm) at 10 GHz and 2 dB of gain compression. It is significant to note that the devices did not degrade during testing into compression, returning to the same performance as before the high power measurement.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A high electron mobility transistor (HEMT) comprising:
   a semi-insulating silicon carbide substrate;
   an aluminum nitride buffer layer on said substrate;
   an insulating gallium nitride layer on said buffer layer;
   an active structure of aluminum gallium nitride on said insulating gallium nitride layer and including a first undoped aluminum gallium nitride layer on said insulating gallium nitride layer, a conductively doped aluminum gallium nitride layer on said first undoped aluminum gallium nitride layer, and a second undoped aluminum gallium nitride layer on said conductively doped aluminum gallium nitride layer;
   a passivation layer on said second undoped aluminum gallium nitride layer;
   respective source, drain and gate electrodes in contact with said second undoped aluminum gallium nitride layer;
   said gate electrode having a gate width of 1.5 mm and a gate length of 0.45 µm, with a gate to source length of 1 µm and a gate to drain length of 1.5 µm; and
   said HEMT being characterized by a power added efficiency of about 28.3 percent at an operating frequency of 10 GHz and a drain bias of about 32 volts.

2. A high electron mobility transistor (HEMT) comprising:
   a semi-insulating silicon carbide substrate;
   an aluminum nitride buffer layer on said substrate;
   an insulating gallium nitride layer on said buffer layer;
   an active structure of aluminum gallium nitride on said insulating gallium nitride layer aud including a first undoped aluminum gallium nitride layer on said insulating gallium nitride layer, a conductively doped aluminum gallium nitride layer on said first undoped aluminum gallium nitride layer, and a second undoped aluminum gallium nitride layer on said conductively doped aluminum gallium nitride layer;
   a passivation layer on said second undoped aluminum gallium nitride layer;
   respective source, drain and gate electrodes in contact with said second undoped aluminum gallium nitride layer;
   said gate electrode having a gate width of 0.125 mm and a gate length of 0.35 µm, with a gate to source length of 1 µm sad a gate to drain length of 2 µm; and
   said HEMT being characterized by a maximum available gain between about 1 dB at a frequency as high as about 30 GHz and about 28 dB at a frequency as low as about 1 GHz.

3. A high electron mobility transistor (HEMT) comprising:
   a semi-insulating silicon carbide substrate;
   an aluminum nitride buffer layer an said substrate;
   an insulating gallium nitride layer on said buffer layer;
   an active structure of aluminum gallium nitride on said insulating gallium nitride layer and including a first undoped aluminum gallium nitride layer on said insulating gallium nitride layer, a conductively doped aluminum gallium nitride layer on said first undoped aluminum gallium nitride layer, and a second undoped aluminum gallium nitride layer on said conductively doped aluminum gallium nitride layer;
   a passivation layer on said second undoped aluminum gallium nitride layer;
   respective source, drain and gate electrodes in contact with said second undoped aluminum gallium nitride layer;
   said gate electrode having a gate width of 1.0 mm and a gate length of 0.45 µm, with a gate to source length of 1 µm and a gate to drain length of 1.5 µm; and
   said HEMT being characterized by a maximum extrinsic transconductance of about 200 mS/mm at a gate to source bias of about −0.5 volts.

4. A high electron mobility transistor (HEMT) as in any one of claims 1–3 wherein the thickness of said aluminum nitride buffer layer is between about 100 and about 5000 Angstroms; and
   said insulating gallium nitride layer is characterized by a thickness of up to 2 microns and an electron carrier concentration less than $10^{15}$ electrons per cubic centimeter.

* * * * *

UNITED STATES PATENT AND TRADEMARK OFFICE
CERTIFICATE OF CORRECTION

PATENT NO.    : 6,583,454 B2  
DATED         : June 24, 2003  
INVENTOR(S)   : Sheppard et al.

Page 1 of 1

It is certified that error appears in the above-identified patent and that said Letters Patent is hereby corrected as shown below:

<u>Column 8,</u>  
Line 24, "sad" should read -- and --.  
Line 34, the second occurrence of "an" should read -- on --.

Signed and Sealed this

Eighteenth Day of November, 2003

JAMES E. ROGAN  
*Director of the United States Patent and Trademark Office*